United States Patent
Herrmann et al.

(10) Patent No.: US 7,548,060 B2
(45) Date of Patent: Jun. 16, 2009

(54) MAGNETIC SENSOR SYSTEM

(75) Inventors: Ingo Herrmann, Leinfelden-Echterdingen (DE); Paul Farber, Stuttgart (DE); Ulrich May, Rutesheim (DE); Christian Bauer, Schwieberdingen (DE); Birgit Vogelgesang, Ingersheim (DE)

(73) Assignee: Robert Bosch GmbH, Stuttgart (DE)

( * ) Notice: Subject to any disclaimer, the term of this patent is extended or adjusted under 35 U.S.C. 154(b) by 291 days.

(21) Appl. No.: 10/564,245

(22) PCT Filed: Jan. 7, 2005

(86) PCT No.: PCT/EP2005/050063

§ 371 (c)(1),
(2), (4) Date: Jan. 11, 2006

(87) PCT Pub. No.: WO2005/088258

PCT Pub. Date: Sep. 22, 2005

(65) Prior Publication Data

US 2007/0290678 A1 Dec. 20, 2007

(30) Foreign Application Priority Data

Mar. 11, 2004 (DE) ................ 10 2004 011 809

(51) Int. Cl.
*G01R 33/02* (2006.01)
*G01R 33/09* (2006.01)

(52) U.S. Cl. .................. 324/252; 324/207.21

(58) Field of Classification Search ............ 324/207.21, 324/207.25, 252, 249, 207.11, 207.24; 123/612, 123/617; 338/32 R, 32 H; 73/862.69, 514.16, 73/514.31, 514.39

See application file for complete search history.

(56) References Cited

U.S. PATENT DOCUMENTS

| 5,789,919 | A | 8/1998 | Umemoto et al. |
| 6,014,023 | A * | 1/2000 | Yokotani et al. ....... 324/207.21 |
| 6,288,533 | B1 * | 9/2001 | Haeberli et al. .......... 324/207.2 |
| 7,173,413 | B2 * | 2/2007 | Kurumado ............ 324/207.21 |

FOREIGN PATENT DOCUMENTS

| DE | 40 38 674 | 6/1992 |
| DE | 44 18 151 | 12/1994 |
| DE | 196 47 420 | 12/1997 |
| DE | 101 28 135 | 12/2002 |

* cited by examiner

*Primary Examiner*—Reena Aurora
(74) *Attorney, Agent, or Firm*—Michael J. Striker

(57) ABSTRACT

A magnetic sensor system (1) is provided that contains sensor elements (5, 6) that are sensitive to magnetic fields, the electrical properties of said sensor elements being modifiable according to a magnetic field that can be influenced by a mobile, passive transmitter element (8). The magnetic sensor system (1) includes two sensor elements (5, 6) in a gradiometer system, each of which is assigned to one of two permanent magnets (2, 3) having a predetermined separation. In terms of their dimensions, separation and position relative to the sensor elements (5, 6), the permanent magnets (2, 3) are located such that the offset of the output signal of the sensor elements (5, 6) is minimized in the gradiometer system.

5 Claims, 3 Drawing Sheets

MAGNETIC SENSOR SYSTEM

CROSS-REFERENCE

The invention described and claimed hereinbelow is also described in PCT/EP 2005/050063, filed on Jan. 7, 2005 and DE 102004011809.4, filed Mar. 11, 2004. This German Patent Application, whose subject matter is incorporated here by reference, provides the basis for a claim of priority of invention under 35 U.S.C. 119 (a)-(d).

BACKGROUND OF THE INVENTION

The present invention relates to a magnetic sensor system, in particular for sensing the motion of elements moved in a linear or rotary manner.

It is known per se that sensors that are sensitive to magnetic fields are used in many applications where contactless detection of motion is desired. The motion can be rotary or linear. A distinction must be made here between two fundamentally different measurement principles. In one case, one or more magnetic dipoles are mounted, as the active elements, on the element to be detected, and the motion is determined directly via the magnetic field, which changes with respect to time, at the point where the sensor is located. In contrast, with passive transmitter elements, which are made of a soft-magnetic material, the magnetic field is produced by a working magnet that is permanently connected with the sensor. The sensor measures the change in the magnetic field of the working magnet caused by the motion of the transmitter elements.

In addition to Hall technology, known per se, for measuring magnetic fields, "XMR" technologies, i.e., magnetoresistive measurement principles, are also finding increasing use, as an alternative, with passive transmitter elements in automotive applications. It should be noted that, unlike Hall sensors, XMR sensors detect the "in-plane" component of the magnetic field in the sensor element. For this purpose, previously common XMR sensors use a working magnet, the field of which must be adjusted such that the offset at the location of the sensitive element is zero, or a "backbias" field will be produced that defines the working point of the sensor.

For example, a concept is described in DE 101 28 135 A1 with which a hard-magnetic layer is deposited in the vicinity of, i.e., in particular on and/or under, a magnetoresistive layer stack. This hard-magnetic layer is then coupled—primarily via its stray field—with the magnetoresistive layers, thereby producing a "bias" magnetic field which acts as the magnetic field offset, so that, even when an external magnetic field superimposed on the internal magnetic field is varied even slightly, an easily measured and relatively great change in the actual measured value is obtainable, the measured value being detected as a change in resistance in the layer stack.

The sensors described above are often utilized in a "gradiometer" system in a manner known per se to measure rotational speed. This means that two branches of a Wheatstone bridge are separated by a specified distance, so that a homogenous magnetic field does not induce a bridge signal. In contrast, a variation of the magnetic field in the region of the predetermined distance produces a bridge signal. The sensor therefore only measures the signal from a magnetic rotor, the distance between the pairs of poles of which approximately corresponds to the predetermined gradiometer separation.

Unlike the use of XMR elements, which perform absolute measurements, the application of the gradiometer principle in a magnetoresistive XMR measurement bridge results in a reduction of the sensitivity of the sensors to homogeneous interference fields. An alignment of the magnets used previously, which was carried out so that the offset can be eliminated at both locations of the sensor elements of the gradiometer system, cannot be carried out in this case, however; although electronic alignment is possible, in principle, a relatively small signal is obtained here with a large offset.

SUMMARY OF THE INVENTION

As a refinement of a magnetic sensor system of the type described initially, the magnetic sensor system according to the present invention has two sensor elements in a gradiometer system, each of which is assigned to one of two permanent magnets having a predetermined separation. In terms of their dimensions, separation and positions relative to the sensor elements, the permanent magnets are located such that the offset of the output signal of the sensor elements is minimized in the gradiometer system.

With the present invention, therefore, the design of a magnetic circuit that produces a working field for a sensor that operates using the gradiometer principle, i.e., by detecting a field gradient, is optimized and therefore enables offset-free operation of the sensor when the magnetic field is varied by mobile transmitter elements, in particular toothed wheels. To this end, the magnetic circuit was created using two individual magnets, the fields of which overlap such that the "in-plane" components of the resultant magnetic field at the gradiometer positions are reduced to the extent that they vary around the zero position due to the influence of the passive transmitter elements. As a result, very small signals can be detected without offset.

This is advantageous, in particular, with highly sensitive magnetoresistive XMR sensors that are designed to cover a large working range, i.e., very large to very small field strengths, without any offset correction, if possible.

With an advantageous embodiment, homogenization plates are located between the sensor elements and the permanent magnets. The field is therefore homogenized in the plane of the sensor elements, and the level of positioning accuracy required of the sensor elements relative to the pair of magnets for offset-free operation is reduced.

It is also advantageous when, according to a further embodiment, the magnetization of each of the permanent magnets is rotated by a specified angle $\alpha$ relative to their longitudinal direction facing the sensor elements.

Due to this pre-magnetization resulting from the tilted position of the field, the sensor elements are located in a magnetic field in which the sensitivity is a maximum due to a "bias" field. An arrangement of the homogenization plates mentioned above is also advantageously possible in this case.

Particularly advantageously, the present invention can be used with a magnetic sensor system for detecting the angle of rotation of a wheel serving as a transmitter element, the wheel, e.g., a steel wheel, being provided, on its circumference, with teeth for influencing the magnetic field in the region of the magnetic sensor system. Applications in an automobile, in particular, include use as a rotational speed sensor on the wheel or crankshaft, a phase sensor on the camshaft, a rotational speed sensor in the transmission or as any other type of linear displacement, angular or proximity sensor with which changes in the magnetic field are induced by mobile metallic elements.

BRIEF DESCRIPTION OF THE DRAWING

Exemplary embodiments of the present invention are explained with reference to the drawing.

DETAILED DESCRIPTION OF THE EXEMPLARY EMBODIMENTS

Figure 1:
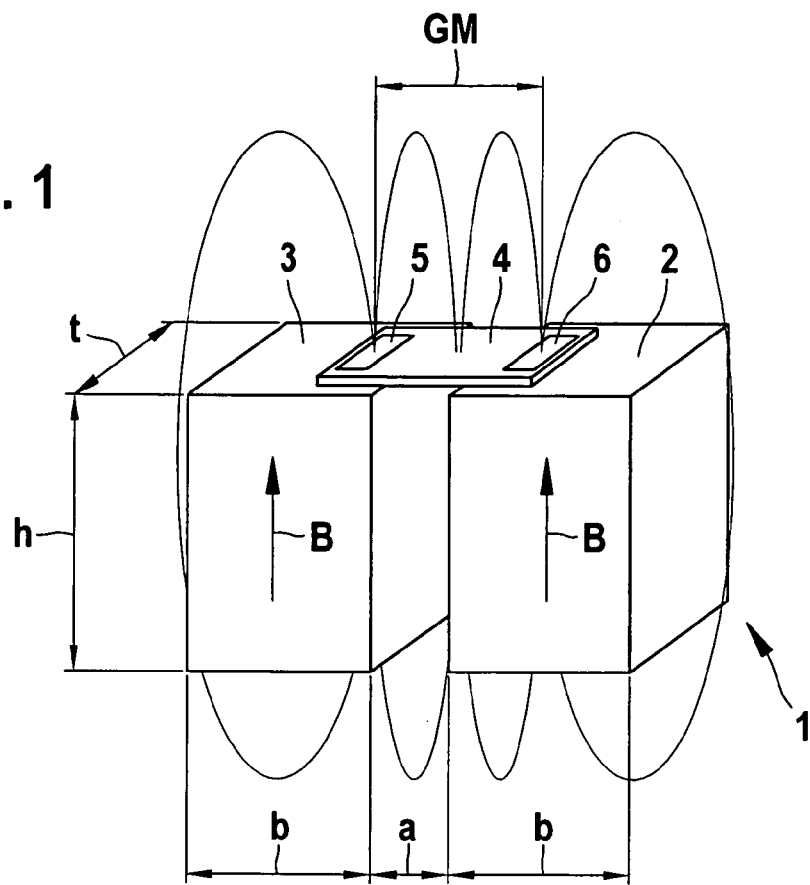
FIG. 1 Shows a schematic illustration of a magnetic sensor system with two permanent magnets, each of which is diametrically opposed to a magnetoresistive sensor element in a gradiometer system, FIG. 2 Shows a system that is refined relative to FIG. 1, with homogenization plates, FIG. 3 Shows an exemplary embodiment of a magnetic sensor system with two permanent magnets which, in contrast to FIG. 1, have a magnetic field positioned at an angle, FIG. 4 Shows an exemplary embodiment according to FIG. 3 with homogenization plates according to FIG. 2, FIG. 5 Shows a view of a magnetic sensor system for a transmitter wheel provided with steel teeth, and FIG. 6 Shows a diagram of the course of the magnetic field as a function of the position of a tooth or a tooth space on a transmitter wheel according to FIG. 5.

FIG. 1 shows a schematic illustration of a magnetic sensor system 1 that includes two permanent magnets 2 and 3, the respective magnetic fields B of which are oriented with lines of flux shown in this illustration in the direction toward a sensor 4. In this case, sensor 4 is designed as an XMR sensor and has two magnetoresistive sensor elements 5 and 6. Sensor elements 5 and 6 are shown in a gradiometer system with gradiometer separation GM; they detect the changes in the particular field gradient caused, e.g., by 5 a metallic transmitter element, e.g., a toothed wheel shown in FIG. 5, that passes by magnetic sensor system 1.

The optimum working point of sensor 4 is adjusted via distance a between magnets 2 and 3 and can be adapted to the gradiometer separation GM of sensor elements 5 and 6. Furthermore, the courses of the lines of flux depend on the dimensions h, b and t of permanent magnets 2 and 3. Given a fixed gradiometer separation GM, e.g., 2.5 mm, the size, material and arrangement, for example, of permanent magnets 2 and 3 can be determined in this case such that sensor 4 functions in an offset-free manner and can therefore detect the smallest possible signals in order to obtain the greatest possible distance away from a transmitter element.

In the absence of a transmitter element, e.g., a toothed wheel, that is moved past externally, the magnetic lines of flux of magnetic sensor system 1 extend such that a small "in-plane" component toward the outside exists at the location of sensor elements 5 and 6. The use, e.g., of a mobile toothed wheel, causes the magnetic field to vary, the "in-plane" components being modulated around the zero position, so that an offset-free signal is produced by the gradiometer system.

Figure 2:
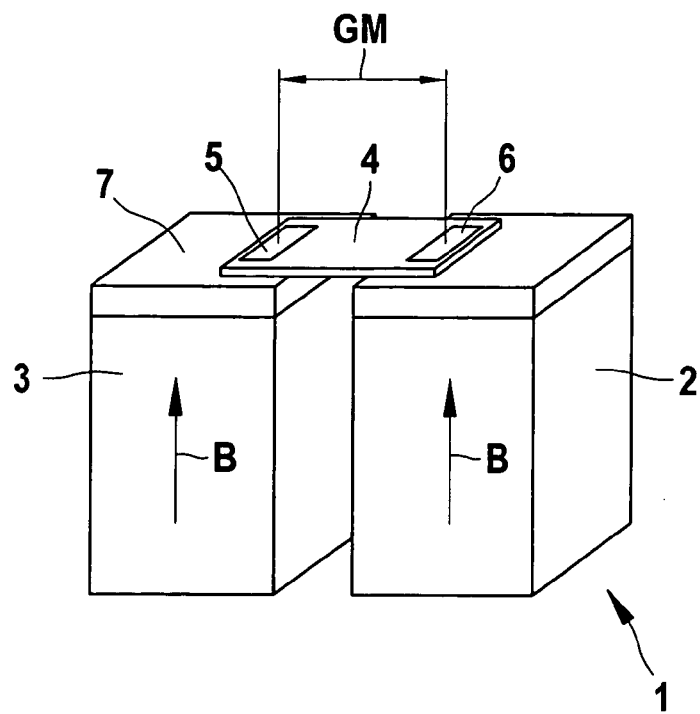

An exemplary embodiment is shown in FIG. 2, with which, in contrast to the exemplary embodiment in FIG. 1, a homogenization plate 7 is provided between the surfaces of permanent magnets 2 and 3 and sensor 4. With this exemplary embodiment, the field is homogenized in the plane of sensor 4 using homogenization plate 7, therefore reducing the level of positioning accuracy required of sensor 4 relative to the pair of magnets 2, 4 to ensure offset-free operation.

With some of the exemplary embodiments that include magnetoresistive XMR sensor elements 5 and 6 described above, the sensor elements require constant pre-magnetization. As a result of this pre-magnetization, sensor elements 5 and 6 are located in a magnetic field in which the sensitivity is a maximum. This "bias" field is realized with the exemplary embodiments shown in FIGS. 3 and 4.

Figure 3:
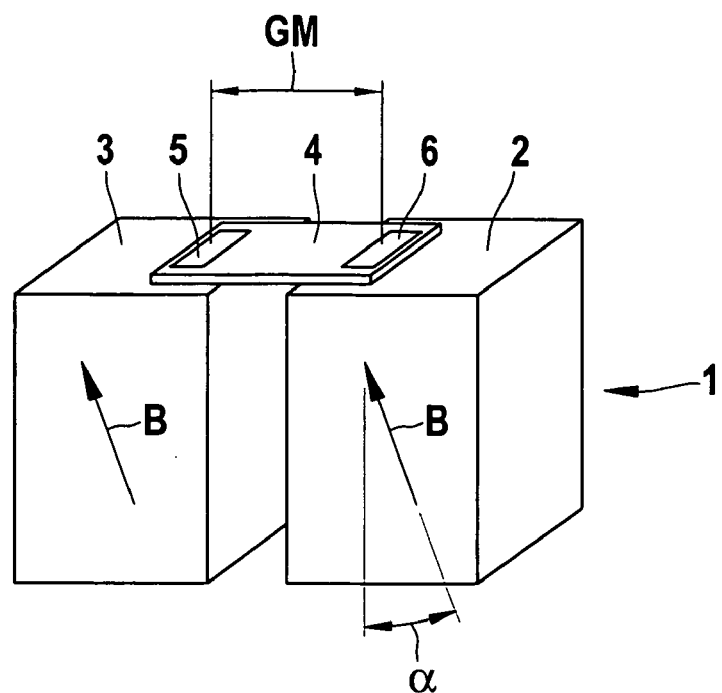
Figure 4:
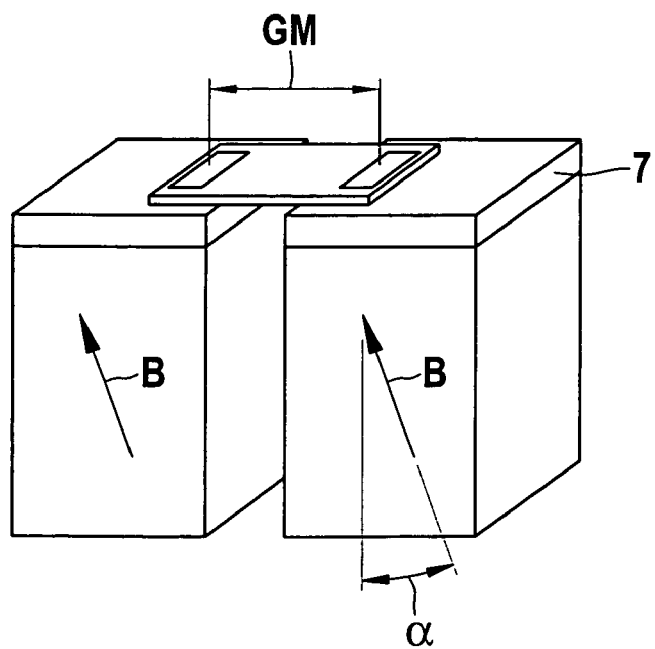

As shown in FIGS. 3 and 4, this is realized by rotating magnetization B in permanent magnets 2 and 3 by angle $\alpha$. In this case, therefore, as described above, two design variations without (FIG. 3) and with improved adjustment using a homogenization plate 7 (FIG. 4) are realized.

Figure 5:
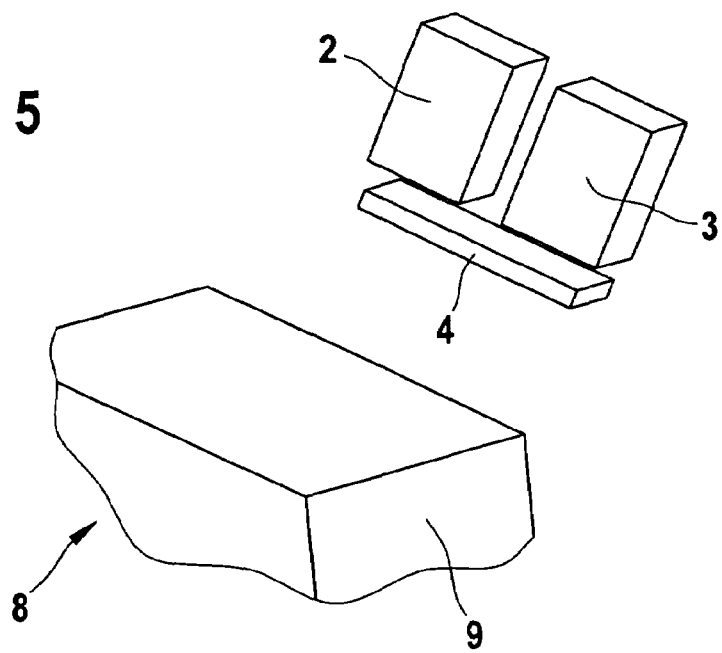
Figure 6:
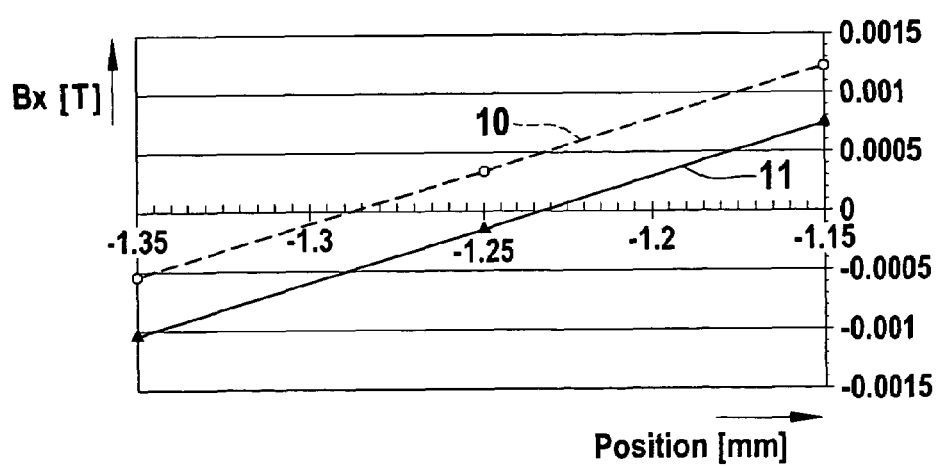

A section of a model is shown in FIG. 5, with which magnetic sensor system 1 according to the present invention, e.g., according to FIG. 1, is used in combination with a transmitter wheel 8 equipped with teeth 9. A measured result is shown in a diagram in FIG. 6 as an example. The "in-plane" component of magnetic field Bx is plotted against the gradiometer position relative to the center of sensor 4, for a tooth 9 (graph 10) and a tooth space (graph 11).

Given a specified test set-up with a gradiometer separation GM of 2.5 mm, it is clear in this case that the course of magnetic field Bx at sensor element position 1.25 mm is symmetrical about the zero position for the two simulated positions of the transmitter wheel 8 (tooth 9, graph 10) and space (graph 11), i.e., the signal of the respective sensor element 5, 6 is offset-free.

What is claimed is:

1. A magnetic sensor system, comprising:
magnetoresistive XMR sensor elements (5, 6) that are sensitive to magnetic fields, electrical properties of said sensor elements being modifiable according to a magnetic field that can be influenced by a mobile, passive transmitter element (8),
wherein the magnetic sensor system (1) has the two magnetoresistive XMR sensor elements (5, 6) in a gradiometer system, each of which is assigned to one of two permanent magnets (2, 3) having a predetermined separation (a) so that a homogenous magnetic field does not induce a bridge signal of a measuring bridge of a magnetic field of the gradiometer system, while a variation of the magnetic field produces a bridge signal; and
wherein in terms of dimensions, separation and position relative to the magnetoresistive XMR sensor elements (5, 6), the permanent magnets (2, 3) are located such that an offset of the output signal of the sensor elements (5, 6) in the gradiometer system is minimized, wherein the two magnetoresistive XMR sensor elements are positioned symmetrically to a central axis between the two permanent magnets.

2. The magnetic sensor system as recited in claim 1, wherein at least one homogenizing plate (7) is located between the sensor elements (5, 6) and the permanent magnets (2, 3).

3. The magnetic sensor system as recited in claim 1, wherein the magnetization of each of the permanent magnets (2, 3) is rotated by a specified angle ($\alpha$) relative to their longitudinal direction facing the sensor elements (5, 6).

4. The magnetic sensor system as recited in claim 1, wherein the magnetic sensor system (1) is configured for detecting the angle of rotation of a wheel (8) serving as a transmitter element, the wheel (8) being equipped, on its circumference, with teeth (9) for influencing the magnetic field in the region of the magnetic sensor system (1).

5. The magnetic sensor system as recited in claim 4, wherein the wheel (8) is a steel wheel.

* * * * *